United States Patent [19]

Steele

[11] Patent Number: 5,027,011
[45] Date of Patent: Jun. 25, 1991

[54] INPUT ROW DRIVERS FOR PROGRAMMABLE LOGIC DEVICES

[75] Inventor: Randy C. Steele, Southlake, Tex.

[73] Assignee: SGS-Thomson Microelectronics, Inc., Carrollton, Tex.

[21] Appl. No.: 429,311

[22] Filed: Oct. 31, 1989

[51] Int. Cl.⁵ .......................................... H03K 19/177
[52] U.S. Cl. ...................................... 307/465; 307/468
[58] Field of Search ............... 307/465, 468, 469, 243, 307/272.2; 340/825.83

[56] References Cited

U.S. PATENT DOCUMENTS

| | | | |
|---|---|---|---|
| 4,758,746 | 7/1988 | Birkner et al. | 307/465 |
| 4,763,020 | 8/1988 | Takata et al. | 307/465 |
| 4,789,951 | 12/1988 | Birkner et al. | 307/465 X |
| 4,879,481 | 11/1989 | Pathak et al. | 307/243 X |
| 4,896,296 | 1/1990 | Turner et al. | 340/825.83 X |
| 4,912,345 | 3/1990 | Steele et al. | 307/468 X |

Primary Examiner—David Hudspeth
Attorney, Agent, or Firm—Kenneth C. Hill; Richard K. Robinson

[57] ABSTRACT

Multi-function input pins in a programmable logic device are connected to select circuitry which is programmed at device program time. Output signals generated by one or more output logic macrocells are also connected to such select circuitry. The select circuitry generates a signal which is used to drive a row of the array. If an input pin is used for providing a control signal, it is not connected to the array, and the output circuitry can drive that row of the array with an output signal which it generates, or with an input signal obtained from an associated input/output pin.

12 Claims, 2 Drawing Sheets

INPUT ROW DRIVERS FOR PROGRAMMABLE LOGIC DEVICES

BACKGROUND OF THE INVENTION

1. Field of the Invention

The present invention relates generally to integrated circuit devices, and more specifically to input and output circuitry useful in a programmable logic device.

2. Description of the Prior Art

Programmable logic devices are becoming increasingly popular in the electronics industry because of their flexibility. These devices allow a user to configure a standard part to perform a wide variety of logic functions. Since a single standard device can be configured many different ways, the total cost of using such a device in a system can be significantly less than the cost of custom designed parts; especially in cases where product volume is not extremely large.

One popular type of programmable logic device has evolved from simpler programmable logic arrays (PLA). These devices include an AND-OR array. In such an array, a plurality of row input lines cross a plurality of product term output lines in such a manner that any row line may be connected to any or all of the product term lines. This is generally implemented as a rectangular grid of horizontal and vertical overlapping signal lines, with the capability of making a connection between two signal lines at each cross-point. The row lines all run in one direction, while the product term signal lines run at right angles to the row lines.

In general, row signal lines are provided to represent the true and inverted values for all input signals to the device. The connection of row signal lines to the product term signal lines provides the AND function of the array. Groups of product term signal lines are OR'd together to provide the OR function of the array. Each group of product term signal lines which are OR'd together are connected to an output logic block which provides output signals to an input/output pin. These output logic blocks are often referred to as output logic macrocells (OLMC).

A typical programmable logic device has several dedicated input pins, which are used solely to provide input signals to the array. Input/output pins connected to the output logic macrocells can typically be programmed to function as output pins, being driven by the associated output logic macrocells, or as additional input pins. When an input/output pin is programmed to function as an input, the associated output logic macrocell is not used. Output logic macrocells typically include both combinatorial and sequential logic, either of which can be used to drive the input/output pin when it is programmed to provide an output signal. The functions of the output logic macrocells are defined at device program time as known in the art.

Many programmable logic devices also include multi-function input pins. These pins can be used as data inputs, in which case they function the same as the dedicated input pins. Alternatively, they can be programmed to perform various control functions, and are used to provide signals such as a device clock signal (used to drive sequential circuitry), input latch enable, and output enable. As is the case with the remainder of the device, these multi-function input pins are programmed to perform a selected function at device program time, with the programming information typically being stored in EEPROM or a similar non-volatile storage.

Additional inputs to the AND-OR array can be provided by feedback signals from the output logic macrocells. When the output logic macrocells are programmed to function in this manner, an output signal is generated which is applied to a row of the array. This feedback output signal may or may not be applied to the associated input/output pin. Such a programmed function for the output logic macrocell is often referred to as a buried logic function.

Physical limitations exist on the number of rows which can be provided in the array. A single row driver, which provides a true and inverted signal to the array, is typically connected to each output logic macrocell. If the cell is programmed to provide a buried output signal, such output signal is provided to this row driver. If the associated input/output pin is programmed to function as an input, it is connected to the same row driver, and the output logic macrocell is unused.

In programmable logic devices, it is always desirable, but often difficult, to make full use of the input and output pins of the device. Providing buried outputs and using input pins to provide control signals limits the number of pins which are available for use as input and output. Using input/output pins for input is also wasteful of resources, since the associated output logic macrocells are not used. It would be desirable to provide circuitry and a device design which allows as complete as possible use of all input and input/output pins on a device.

SUMMARY OF THE INVENTION

It is therefore an object of the present invention to provide circuitry connected to input and output signal pins which allows better utilization of AND-OR array inputs in a programmable logic device.

It is a further object of the present invention to provide such circuitry which allows array row drivers for multi-function input pins to be utilized when the associated input pins are used for control functions.

It is another object of the present invention to provide such circuitry which allows output logic circuitry to be used to generate feedback signals while using an associated input/output pin for input.

Therefore, according to the present invention, multi-function input pins in a programmable logic device are connected to select circuitry which is programmed at device program time. Output signals generated by one or more output logic macrocells are also connected to such select circuitry. The select circuitry generates a signal which is used to drive a row of the array. If an input pin is used for providing a control signal, it is not connected to the array, and the output circuitry can drive that row of the array with an output signal which it generates, or with an input signal obtained from an associated input/output pin.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
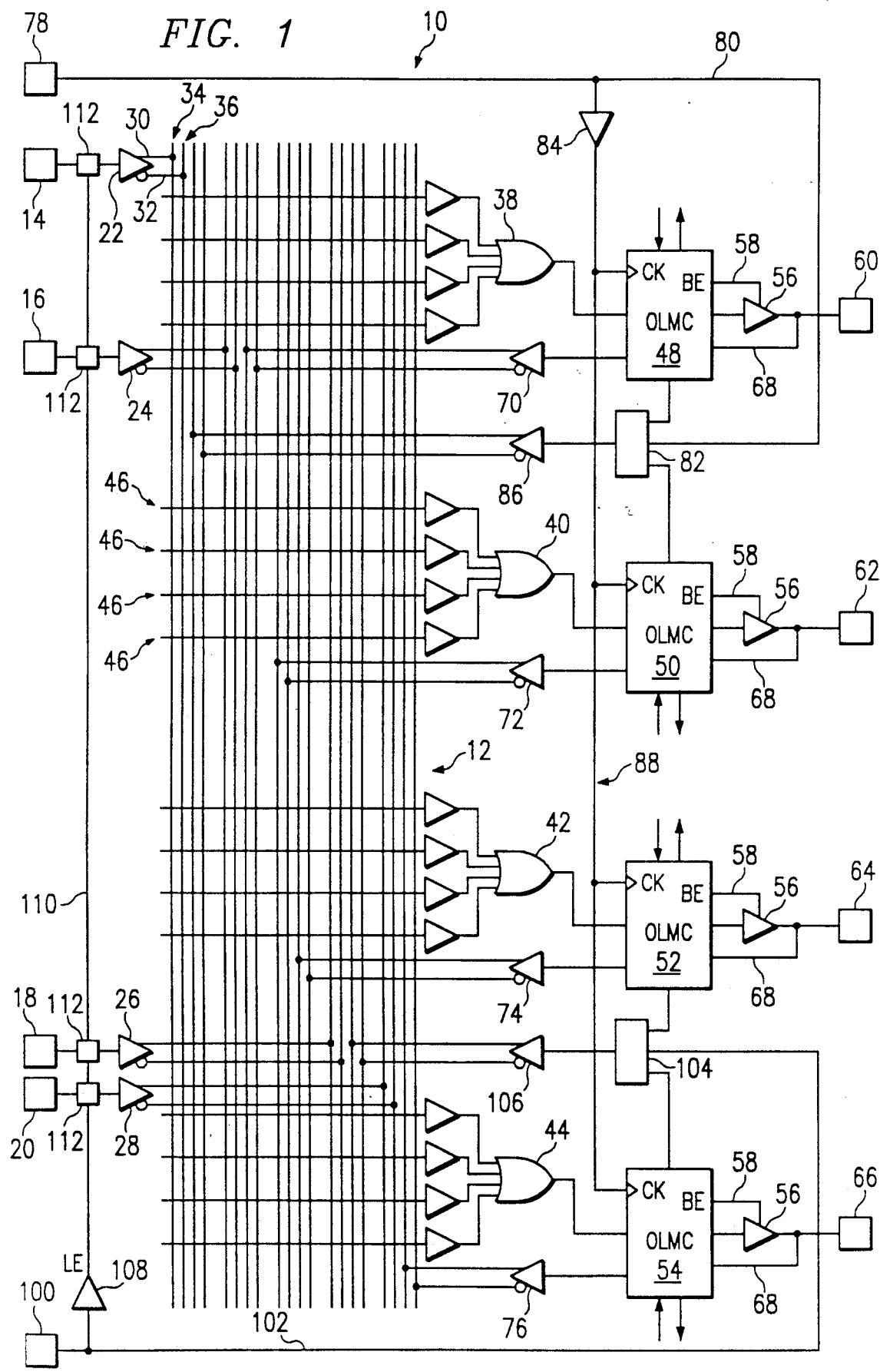
FIG. 1 is a diagram of a portion of a programmable logic device according to the present invention.

Referring to FIG. 1, a programmable logic device, referred to generally with reference number 10, contains an AND-OR array 12. As shown in FIG. 1, row signal lines run vertically in the drawings, and product term signal lines run horizontally. For clarity of explanation, FIG. 1 illustrates only a small number of row and product term signal lines. As will be appreciated by those skilled in the art, an actual programmable logic device constructed according to the present invention will typically have a much larger number of row and product term signal lines.

Dedicated input signal pins 14, 16, 18, 20 are connected to associated row drivers 22, 24, 26, 28, respectively. Each row driver generates a true and inverted signal corresponding to its input. These signals are connected to separate rows within the array 12. For example, row driver 22 generates a true signal on signal line 30 and an inverted signal on line 32. The signal lines 30, 32 are connected to row lines 34 and 36 respectively. As is known in the art, only one input signal is connected to each row signal line, and connection may be made between any given row signal line and any or all product term signal lines in the array 12. Each of the remaining row drivers 24, 26, 28 connected to dedicated input pins 16, 18, 20 provides input to the array 12 in a similar manner.

OR gates 38, 40, 42, 44 provide a logical OR function of several product term lines. For example, gate 40 ORs together the four product term signal lines 46. This provides the OR function of the array 12. Although only four product term signal lines 46 are shown connected to each OR gate, a larger number is typically provided in actual devices.

The outputs of OR gates 38, 40, 42, 44 are connected to output logic macrocells (OLMC) 48, 50, 52, 54, respectively. Each OLMC drives an output buffer 56 and provides a buffer enable signal line 58 to enable or disable the output buffers 56. The various output buffers 56 are used to drive the input/output pins 60, 62, 64, 66 associated with the OLMCs. Input signal lines 68 are also connected to each input/output pin in order to provide a signal path between the input/output pin and the associated OLMC when such pin is used for input.

Each OLMC 48, 50, 52, 54 provides an output signal to an associated row driver 70, 72, 74, 76. As described above, each row driver 70-76 provides true and inverted inputs to the array 12.

Input pin 78 is a multi-function pin used to provide either an input signal to the array 12 or a clock signal for the output logic macrocells 48-54. Signal line 80 is used to connect input pin 78 to a select circuit 82 and a buffer 84. As will be described in more detail in connection with FIG. 2, when pin 78 is programmed to function as an input pin, select circuit 82 connects signal line 80 with row driver 86. When pin 78 is programmed to provide a clock signal, select circuit 82 ignores all signals present on line 80. Instead, buffer 84 provides a clock signal on line 88 to each of the OLMCs. When pin 78 is used as an input pin, each of the OLMCs is programmed to ignore the signal which is present on clock signal line 88. Alternatively, buffer 84 can be programmed to generate a fixed value regardless of input.

Pin 100 is also a multi-function pin. It can be programmed to provide an input signal to the array, or to provide a latch enable (LE) signal to latch the signals present on input pins 14-20. When pin 100 is programmed to function as an input pin, signal line 102 connects input pin 100 to select circuit 104. Select circuit 104 connects the signal on line 102 to row driver 106, which applies the signal present on input pin 100 to the array 12.

When pin 100 is programmed to function as a latch enable signal, select circuit 104 ignores all signals present on line 102. Instead, buffer 108 is used to generate a latch enable signal on line 110. Signal line 110 is connected to input latches 112, which are used to latch the current values of the signals available on input pins 14-20 when the signal on pin 100 has the appropriate value. When pin 100 is being used as an input pin, latches 112 are programmed to ignore the output of buffer 108, and the signals on input pins 14-20 are transmitted directly to the associated row drivers 22-28.

Select circuits 82, 104, in addition to being connected to signal lines 80, 102 as described above, are connected to outputs from the adjacent OLMCs. Thus, select circuit 82 has three inputs: one found on signal line 80 and one each provided by OLMCs 48 and 50. A selected one of these inputs can be connected to row driver 86, with the input to be connected being selected at device program time. If desired, select circuit 82 can be programmed to connect no inputs to row driver 86. The OLMCs can be programmed to provide one of several possible outputs directly to the associated row driver and the adjacent select circuit. This allows a wide variety of input signal combinations to be connected to the array 12. For example, if pin 78 is used to provide a clock signal, OLMC 48 can be programmed to provide a buried output feedback signal to row driver 70, and to use input/output pin 60 as an input by connecting it to row driver 86 through select circuit 82.

Figure 2:
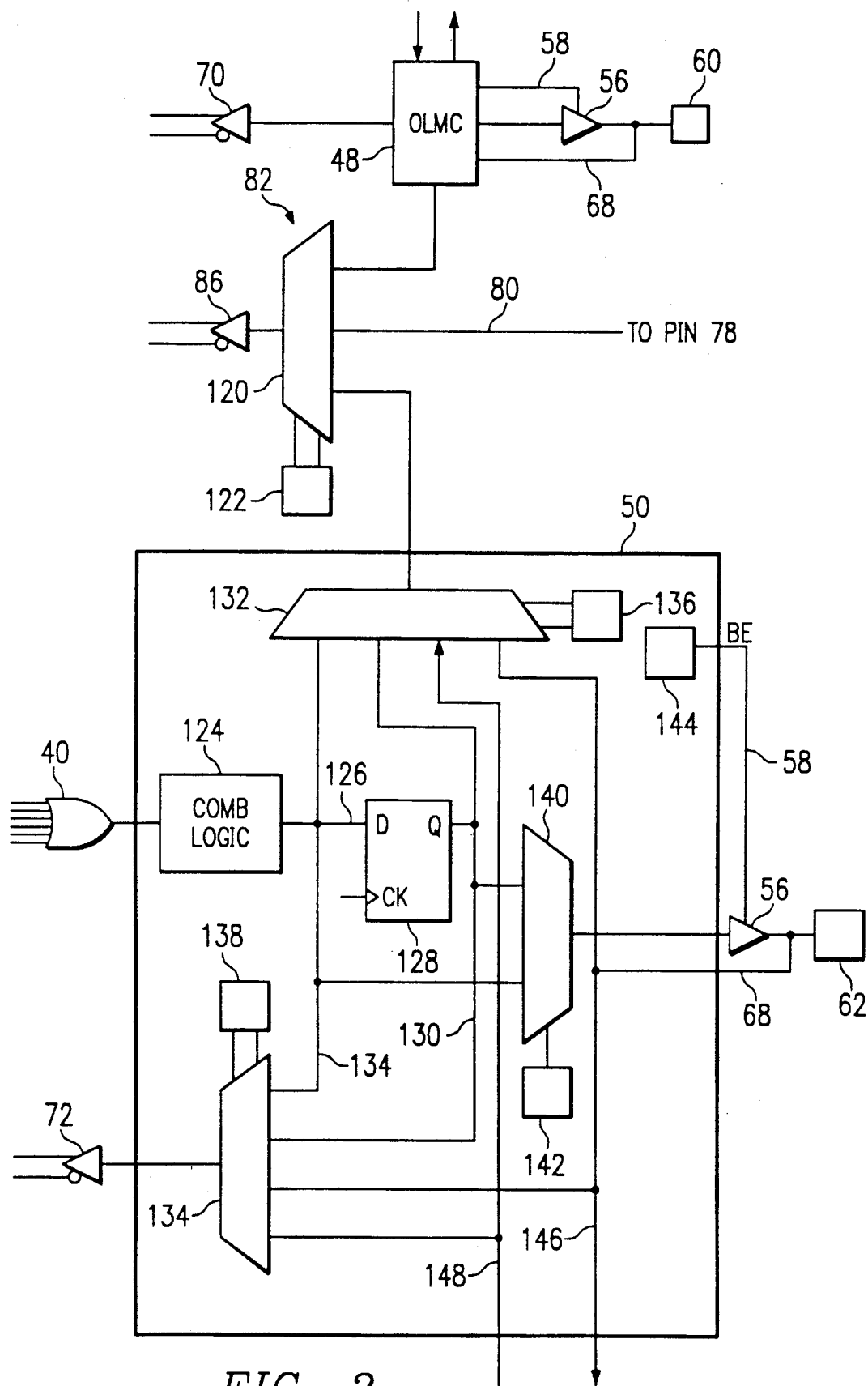
FIG. 2 is a block diagram of an output logic macrocell and associated select circuitry according to the present invention.

Referring to FIG. 2, details are shown of a preferred implementation for the output logic macrocells and select circuits. Only OLMC 50 is shown in detail, but the remaining OLMCs function in the same manner.

Select circuit 82 contains a multiplexer 120 having three inputs. A program latch 122 contains the program bits used to select an input line to the multiplexer 120 to be connected to row driver 86. Since three input lines are connected to multiplexer 120, two program bits must be provided by the program latch 122. The four bit combinations provided by program latch 122 cause either one of the three inputs to be connected to row driver 86, or no input (i.e., a predefined value) to be so connected.

Output logic macrocell 50 contains combinatorial logic 124 connected to the output of OR gate 40. As known in the art, various combinatorial logic functions may be defined in the combinatorial logic block 124 through the use of program latches and multiplexers. At least one combinatorial logic output signal line 126 is provided, and is preferably connected to the input of flip-flop 128, which can be, for example, a D flip-flop as shown. Flip-flop 128 has a clock input signal connected to signal line 88 as shown in FIG. 1 and has a Q output connected to signal line 130. If desired, the inverted output front flip-flop 128 may be provided and connected to other logic elements, but this is not shown in FIG. 2.

The outputs from combinatorial logic circuitry 124 and flip-flop 128 are provided to multiplexers 132 and 134. Multiplexer 132 is controlled by program latch 136 and provides an output signal for connection to multiplexer 120. Multiplexer 134 is controlled by program latch 138, and provides an output signal for connection to row driver 72.

The outputs from the combinatorial logic block 124 and D flip-flop 128 are also connected to multiplexer 140 which is controlled by program latch 142. Multiplexer 140 provides the output signal which is connected to output buffer 56, and either the sequential output signal from flip-flop 128, or the non-sequential signal from combinatorial logic 124, may be selected. A buffer enable signal is provided to buffer 56 on line 58 by output buffer control circuitry 144. If a multi-function input is used to provide an output enable signal (not shown), such signal will be connected to control circuitry 144 in order to provide the buffer enable signal on line 58.

As described above, pin 62 can be defined to function as either an output pin or an input pin. If pin 62 functions as an output pin, it is driven by output buffer 56 as described above. If pin 62 is to be used for input, a program latch included with output buffer control circuitry 144 applies a buffer enable signal to line 58 which permanently disables output buffer 56. Signal line 68 is then used to connect signal pin 62 with the OLMC 50.

When pin 62 is defined to function as an input pin, it is necessary that it be connected to a row driver to the array. This is accomplished by connecting signal line 68 to both multiplexer 132 and multiplexer 134. This allows the signal on input pin 62 to be used to drive either row driver 72 or row driver 86. Signal line 68 is also connected to signal line 146, which provides an output signal from OLMC 50. Signal line 146 is connected to another OLMC (not shown), and can be connected therethrough to a row driver. Signal line 148 provides an input signal from another OLMC, which may or may not be the OLMC to which signal line 146 is connected. Signal line 148 is connected to both multiplexer 132 and multiplexer 134. Signal line 148 is connected through the other OLMC to the input/output pin associated with such other OLMC. An output line analogous to output signal line 146 from the other OLMC provides the signal connected to signal line 148 in OLMC 50.

As will be appreciated by those skilled in the art, a wide variety of signal combinations may be applied to row drivers 72 and 86. This may be done in combination with use of input pin 62 as either an input pin or an output pin. For example, signal line 80 could be connected to row driver 86 through multiplexer 120; output pin 62 could be driven by the output from combinatorial logic circuitry 124, and the input/output pin of another OLMC can be used as an input pin and connected to row driver 72 through signal line 148 and multiplexer 134. As another example, a signal on line 80 could be used as a clock signal; pin 62 could be used as an input pin and connected to row driver 72 through signal line 68 and multiplexer 134; and a buried output signal can be generated by the output of flip-flop 128, and connected to row driver 86 through multiplexer 132 and multiplexer 120.

Although only two multi-function input pins have been described, actual devices can have four or more. Any type of control function can be treated in a manner similar to that described, as will be apparent to those skilled in the art.

Use of the selection circuitry described herein allows for increased utilization of available row drivers. It also allows an output logic macrocell to be used for buried output while its associated input/output pin is used to provide an input signal to the device. This increased utilization of the limited number of input and output pins available on a programmable logic device can allow such device to be programmed to perform logic operations which could previously only be performed on programmable logic devices having a greater number of input and output pins. Such increased utilization can contribute to an overall decreased system cost for systems containing the programmable logic device.

While the invention has been particularly shown and described with reference to a preferred embodiment, it will be understood by those skilled in the art that various changes in form and detail may be made therein without departing from the spirit and scope of the invention.

What is claimed is:

1. An input circuit for a programmable logic device having an AND-OR array and a plurality of output circuit blocks, comprising:
   a row driver buffer having an output connected to the array; and
   a multiplexer having an output connected to said row driver buffer, and having inputs connected to an input pin and to an output of at least a first output circuit block;
   wherein one of the multiplexer inputs is connected to the multiplexer output according to program information stored with said multiplexer when the device is programmed.

2. The input circuit of claim 1, wherein said multiplexer has inputs connected to first and second output circuit blocks and the input pin.

3. The input circuit of claim 1, wherein the input pin is also connected to an alternate buffer so that the input pin can be used to provide a control signal instead of an input signal.

4. The input circuit of claim 1, wherein the output of the first output logic block connected to said multiplexer contains one of the following signals:
   a signal provided as input to a pin connected to the output logic block;
   a combinatorial logic signal generated by the output logic block; or
   a sequential logic signal generated by the output logic block.

5. The input circuit of claim 1, wherein the output of the first output logic block connected to said multiplexer contains one of the following signals:
   a signal provided as input to a pin connected to the output logic block;
   a combinatorial logic signal generated by the output logic block;
   a sequential logic signal generated by the output logic block; or
   an output signal provided from a second output logic block adjacent to the first output logic block and not connected directly to said select circuitry.

6. A logic circuit for use in a programmable logic device having an AND-OR array, comprising:
   a row driver connected to the array;
   a selector connected to said row driver;
   a device input pin connected to said selector; and
   an output logic block having an input connected to the array, an input connected to a device input- /output pin, an output connected to the device input/output pin, and an output connected to an input of said selector.

7. The circuit of claim 6, further comprising:
a second output logic block having an input connected to the array, an input connected to a second device input/output pin, an output connected to the second device input/output pin, and an output connected to an input of said selector.

8. The circuit of claim 6, wherein said output logic includes a second selector providing the output connected to an input of said selector, said second selector having inputs connected to:
the device input/output pin;
an output of a combinatorial logic circuit within said output logic circuit; and
an output of a clocked logic device within said output logic circuit.

9. The circuit of claim 8, wherein said second selector also has an input connected to a second device input/output pin through a second output logic block.

10. A programmable logic device, comprising:
an AND-OR array;
a plurality of dedicated device input pins connected to said array through row buffers;
a plurality of output logic blocks having inputs connected to said array, and having inputs and outputs connected to device input/output pins corresponding therewith;
an input selector having an output connected to a row driver connected to said array, and having at least one input connected to an output logic block; and
an input pin connected to an input of said input selector and to an alternative input buffer for performing control functions;
wherein at least one output logic block further includes selection means for providing to said input selector a signal selected from the following: an output of a combinatorial logic circuit within the output logic block, an output from a clocked device within the output logic block, and a signal present on the corresponding device input/output pin.

11. The device of claim 10, wherein said selection means comprises a multiplexer.

12. The device of claim 10, wherein said selection means provides the signal with the further possible selection of: a signal present on a device input/output pin corresponding to output logic block not connected directly to said input selector.

* * * * *